July 19, 1960 S. K. BENJAMIN ET AL 2,946,018

CRYSTAL-CONTROLLED TRANSISTOR OSCILLATOR

Filed Sept. 24, 1958 2 Sheets-Sheet 1

INVENTOR.
SIDNEY K. BENJAMIN
THEODORE KWAP
BY
ATTORNEY.

INVENTOR.
SIDNEY K. BENJAMIN
THEODORE KWAP
BY H. S. Mackey
ATTORNEY.

United States Patent Office 2,946,018

Patented July 19, 1960

2,946,018

CRYSTAL-CONTROLLED TRANSISTOR OSCILLATOR

Sidney K. Benjamin, New Rochelle, and Theodore W. Kwap, Brewster, N.Y., assignors to General Precision, Inc., a corporation of Delaware Filed Sept. 24, 1958, Ser. No. 762,968

5 Claims. (Cl. 331—116)

This invention relates to transistor oscillators in which the frequency of oscillation is controlled by a piezoelectric crystal. The invention more specifically relates to such oscillators for operation in the kilocycle frequency range.

In low frequency crystal-controlled oscillators, as the frequency for which the oscillator is designed is reduced, the equivalent series resistance and the equivalent shunt capacitance of the associated crystal increase. Because of this it is difficult to design an oscillator for low frequencies which does not jump between two slightly separated frequencies. It is found, however, that if the piezoelectric crystal be operated in its inductive mode this does not occur; the crystal operates at only a single frequency.

As is well known, a piezoelectric quartz crystal can be operated at a series-resonant frequency $f_s$, and the same crystal can be operated alternatively at a somewhat different parallel-resonant or antiresonant frequency, $f_a$. When operation is induced at a frequency between $f_s$ and $f_a$ the crystal exhibits inductive reactance. It is operation in this frequency region which is termed operation in the inductive mode.

The present invention provides a transistor circuit suitable for frequency control by a piezoelectric quartz crystal operated in the inductive mode. The oscillatory portion includes a closed loop containing two transistors and a crystal. The output of one transistor is connected to the input of the other transistor, and its output is connected back through the crystal to the input of the first transistor, forming a closed loop.

In order for this closed loop to oscillate it must have a phase shift of zero, 360°, or a multiple thereof around the loop, and the gain at equilibrium must be unity around the loop. In order to secure a voltage phase retardation around the loop of 360° one of the transistors is operated in a common-emitter circuit, providing 180° phase shift, and two capacitor circuits are provided, each having somewhat less than 90° output voltage lag. The remainder of the voltage lag to make a total of 360° is provided by the inductive reactance of the crystal.

Direct current stabilization of the oscillatory loop is secured by direct current degenerative feedback through a high resistance. The impedance at signal frequencies of this high resistance is increased by a factor of ten by bootstrapping.

This invention has for its purpose the provision of a crystal-controlled transistor oscillator circuit which employs the crystal in its inductive mode, and which therefore insures operation at only a single frequency.

A further understanding of this invention may be secured from the detailed description and drawings, in which.

Figure 1:
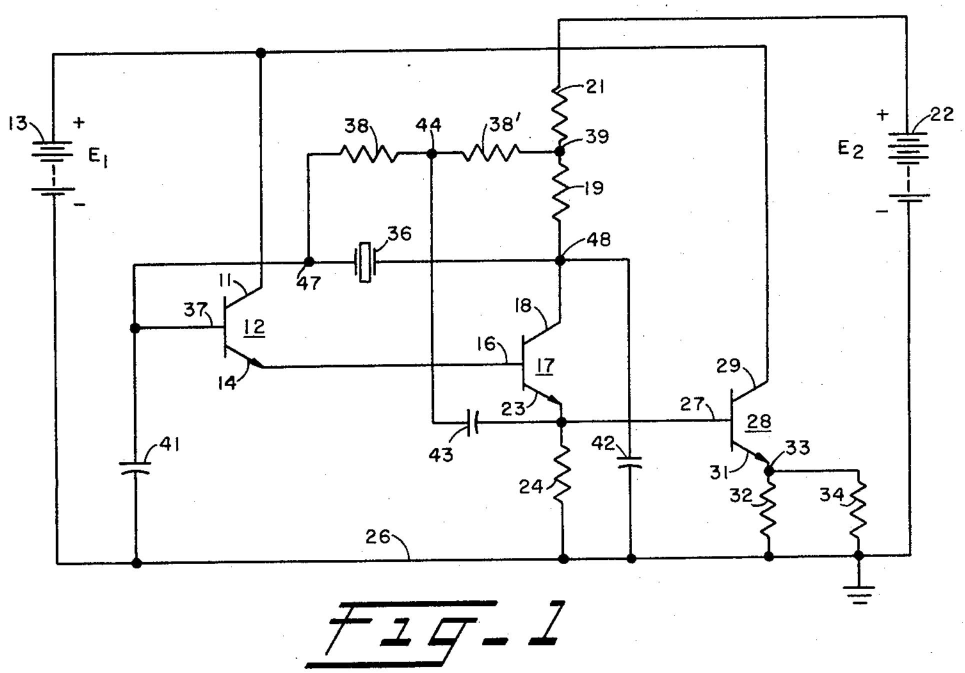
Figure 1 is a schematic circuit diagram of an embodiment of the invention.

Referring now to Fig. 1, the collector 11 of an NPN transistor 12 is connected to a source of positive potential 13 of $E_1$ volts. The emitter 14 is connected to the base 16 of a second NPN transistor 17. Its collector 18 is connected through resistors 19 and 21 in series to the positive terminal of a source of power 22 having a potential of $E_2$ volts. The emitter 23 is connected through a resistor 24 to the common battery return conductor 26, which may be grounded. The emitter 23 is also connected directly to the base 27 of a third NPN transistor 28 having its collector 29 connected to the source 13 and having its emitter 31 grounded through a resistor 32. The emitter terminal 33 constitutes the oscillator output terminal and the load 34 is connected between this terminal and ground.

The oscillatory loop of this oscillator includes the two transistors 12 and 17 and a quartz crystal 36 which is connected between collector 18 and the base 37 of transistor 12.

This oscillator is especially useful when designed for oscillation at a frequency between 10 and 100 kilocycles per second. The quartz crystal 36 for use in this range is preferably a crystalline quartz plate, metal-plated and wire-mounted in a metal holder for operation at the fundamental frequency of vibration of the plate. Such a crystal and holder are normally employed for operation at the series-resonant frequency $f_s$, but are here operated in the inductive region of frequency. An example of a satisfactory quartz crystal is one of the type termed CR 50/U.

Two relatively high resistance resistors 38 and 38' are connected in series between the junction 39 of resistors 19 and 21 and the base 37. One function of these resistors is to provide paths for currents giving positive biases of about ½ volt to the bases 37 and 16 relative to their respective emitters. A second function of these resistors is to provide direct-current negative feedback to stabilize the operation of transistors 12 and 17. A capacitor 41 is connected between base 37 and ground and a capacitor 42 is connected between collector 18 and ground. A capacitor 43 is connected between the common point 44 of resistors 38 and 38' and emitter 23.

For operation of this oscillator in the prescribed frequency range at, for example, 20 kc. p. s., the following values are typical:

| | | |
|---|---|---|
| Potential $E_1$ | volts | +25 |
| Potential $E_2$ | do | +150 |
| Resistor 21 | ohms | 470,000 |
| Resistor 19 | do | 47,000 |
| Resistor 24 | do | 10,000 |
| Capacitor 41 | μμf | 100 |
| Capacitor 42 | μμf | 180 |

In place of any or all of the NPN transistors the PNP type may be substituted with appropriate reversal of the bias potentials applied thereto.

Figure 2:
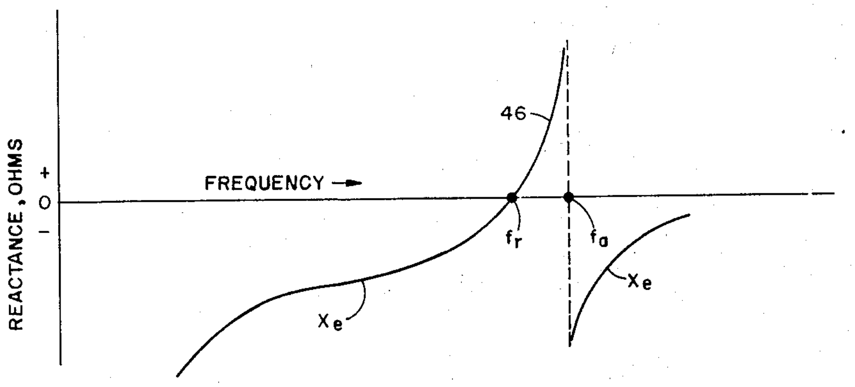
Figure 2 shows the characteristic variation of the reactance of a piezoelectric crystal with frequency.
Figure 3:
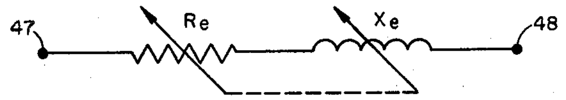
Figure 3 is an equivalent circuit diagram of a piezoelectric crystal.

The general description of the operation of this oscillator depends on the characteristic variation of the reactance of a quartz crystal with frequency. A curve, not to scale, showing this variation is depicted in Fig. 2. The equivalent reactance, $X_e$, exhibited by a crystal plate is shown, passing through zero at the series resonance frequency $f_r$ and becoming very high at the parallel or antiresonant frequency $f_a$. Between these two frequencies the arm 46 of the characteristic curve indicates that the reactance is positive. That is, the quartz crystal 36 in Fig. 1 produces an output potential to ground at its terminal 47 which lags the potential at its input terminal 48, as if the crystal were replaced by a series inductance coil. One way of depicting the equivalent circuit of the crystal thus operated is by an effective inductive reactance $X_e$ in series with an effective resistance $R_e$, both of them varying with the frequency. This is shown in Fig. 3.

Figure 4:
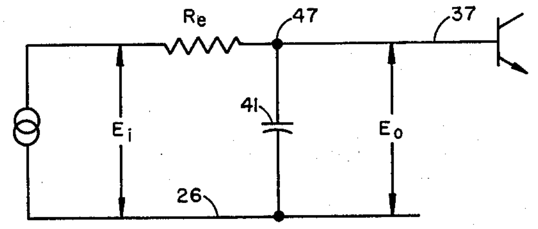
Figures 4 and 5 are equivalent circuit diagrams of the phase retarding circuits of the invention.

The signal or oscillatory energy fed back through the crystal 36 to the base 37 is phase shifted by nearly 90° by the capacitor 41, so that the phase of the potential applied to the base is retarded by this amount relative to the phase of the potential passed through the crystal. This is because, as shown in Fig. 4, the signal or oscillatory potential $E_i$, after passing through the equivalent inductive reactance $X_e$, Fig. 3, may be considered to be applied to capacitor 41 through the equivalent resistance, $R_e$, of the crystal. The potential $E_o$ across the capacitor 41 therefore lags the applied potential $E_i$.

Figure 5:
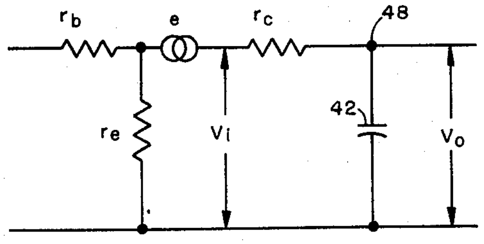

The signal applied to the base 16 of transistor 17 undergoes a phase reversal in passing to the collector terminal 48 and is given a further voltage phase lag of nearly 90° by the capacitor 42. The equivalent circuit of the transistor 17 may be shown as in Fig. 5. In this figure $e$ is a voltage equivalent of the transistor voltage gain and $r_0$ is the internal collector resistance. If $V_i$ be considered the signal potential applied to this resistance, then the output potential $V_o$ across capacitor 42 lags $V_i$. This potential $V_o$ is applied to the quartz crystal 36.

It is thus seen that the sum of all phase shifts around the oscillatory loop can equal a lag of 360° as follows: 180° through transistor 17, nearly 90° lag at the base 37 due to capacitor 41, nearly 90° lag at collector terminal 48 due to capacitor 42, and a small inductive lag through the crystal 36. In the operation of this circuit, the crystal 36 sets itself at such an operating frequency that its effective inductive reactance, $X_e$, becomes of exactly the right amount to produce exactly 360° lag around the loop.

The operation of transistor 17 is in the common collector mode in applying an output signal to the load 34, but is in the common emitter mode in the oscillatory loop. In the latter mode of operation this transistor has a voltage gain approximately given by $$\frac{-\alpha Z_L}{r_e} \qquad (1)$$

in which $\alpha$ is the short circuit current amplification factor for a common base stage, $Z_L$ is the load impedance, and $r_e$ is the equivalent internal emitter resistance. In order for this circuit to oscillate, the gain must be sufficient, therefore $Z_L$ in (1) must be high. $Z_L$ consists approximately of the resistors 19 and 21 in parallel with the impedance of capacitor 41 and also in parallel with the impedance presented by the transistor 12 at its base 37. It thus is necessary that this base impedance be high, preferably much higher than the impedance of capacitor 41, which here means that the base impedance should be of the order of one megohm. The base impedance may be considered all resistance and is approximately $$r_{b37}=(\beta+1)r_{L14} \qquad (2)$$

in which $r_{b37}$ is the resistance offered at the base 37 of transistor 12, $\beta$ is the grounded emitter current amplification factor, with a value of not less than 10, and $r_{L14}$ is the resistance of the load connected to the emitter 14. Similarly, the base resistance $r_{b16}$ offered by transistor 17 at its base 16 due to the load $r_{L23}$ applied to its emitter 23 is $$r_{b16}=(\beta+1)r_{L23} \qquad (3)$$

Similarly, the resistance $r_{b27}$ offered by transistor 28 at its base 27 due to the load $r_{L31}$ applied to its emitter 31 is $$r_{b27}=(\beta+1)r_{L31} \qquad (4)$$

Thus the resistance offered at base 37 is approximately $$r_{b37}=\beta^2 r_{L23} \qquad (5)$$

in which $r_{L23}$ is somewhat less than the resistance of resistor 24 alone. The resistance offered at base 37 is thus found to be high so that the impedance of capacitor 41 is the major factor in the impedance of the load on collector 48. With the values given, the gain of transistor 17 is ample to sustain oscillation.

The resistors 38 and 38' supply bias potential to the bases 37 and 16, as has been mentioned, and also provide degenerative direct-current feedback. In performing this latter function, when the potential of base 16 increases, the potential of collector terminal 48 decreases, decreasing the bias potential on base 37, this decreases the bias potential on base 16, thus tending to neutralize its original change and constituting degenerative feedback.

It has been found that when resistors 38 and 38' are each of the order of 2 megohms their operation is satisfactory. However, in order to conserve the signal at base 37 it is desirable to increase the impedance of this path at the signal frequency. This is done by "bootstrapping" the junction 44 through a large capacitor 43 to the emitter 23. The signal there, having an amplitude about 94% of that at the base 37 and an equal phase, is thus fed back to the terminal 44 of resistor 38. Since this resistor 38 also has its terminal 47 connected to base 37, the current through this resistor is reduced to 6% of the amount which would flow in the absence of the bootstrap. Thus the resistor 38 behaves with regard to signal loss as if it had a resistance of 33 megohms.

What is claimed is:

1. A crystal-controlled transistor oscillator comprising, a first transistor, a common collector circuit therefor, a second transistor, a common emitter circuit therefor, a piezoelectric crystal for operation at a selected frequency having an equivalent circuit represented by a reactance in series with an equivalent resistance, said reactance being inductive at said selected frequency, a connection from the emitter of said first transistor to the base of said second transistor, a connection from the collector of said second transistor to one terminal of said piezoelectric crystal, a connection from the other terminal of said piezoelectric crystal, to the base of said first transistor, a resistor connected between the emitter of said second transistor and a common conductor, direct-current source means connected between said common conductor and said common emitter and common collector circuits, a capacitor connected between the base of said first transistor and said common conductor which in combination with said equivalent resistance of the piezoelectric crystal substantially retards the phase of the potential applied from the crystal to the base of the first transistor, and a capacitor connected between the collector of said second transistor and said common conductor which in combination with the internal collector resistance of the second transistor substantially retards the phase of the potential applied by the collector to said one terminal of the piezoelectric crystal, whereby the sum of the phase retardations through said second transistor, said piezoelectric crystal operating in its inductive mode, and through said two capacitor phase-retarding circuits equals 360 degrees.

2. A crystal-controlled transistor oscillator comprising, a first transistor, a common collector circuit therefor, a second transistor, a common emitter circuit therefor, a piezoelectric crystal for operation at a selected frequency in its inductive mode, means connecting the emitter of said first transistor to the base of said second transistor, means connecting the collector of said second transistor to one terminal of said piezoelectric crystal, means connecting the other terminal of said piezoelectric crystal to the base of said first transistor, a direct-current source connected between the emitter of said second transistor and said common emitter and common collector circuits, phase-retarding circuit means connected between the base of said first transistor and said direct-current source and other phase-retarding circuit means connected between the collector of said second transistor and said direct-current source.

3. A crystal-controlled transistor oscillator comprising, a first transistor, a common collector circuit therefor, a second transistor, a common emitter circuit therefor, a piezoelectric crystal for operation at a selected frequency at which the reactance thereof is inductive, conductive means connecting the emitter of said first transistor to the base of said second transistor, conductive means connecting the collector of said second transistor to one terminal of said piezoelectric crystal, conductive means connecting the other terminal of said piezoelectric crystal to the base of said first transistor, a direct-current source connected between the emitter of said second transistor and the collectors of said transistors, a phase-retarding capacitor connected between the base of said first transistor and said direct-current source, another phase-retarding capacitor connected between the collector of said second transistor and said direct-current source and a load connected to the emitter of said second transistor.

4. A crystal-controlled transistor oscillator in accordance with claim 1 in which a high resistance load circuit is connected to the emitter of said second transistor, whereby the input impedance of the base of said first transistor is maintained at a high value.

5. A crystal-controlled transistor oscillator in accordance with claim 1 including negative feedback resistor means connected between the collector of said second transistor and the base of said first transistor whereby the operation of the oscillator is stabilized.

References Cited in the file of this patent

FOREIGN PATENTS 771,067 Great Britain ---------- Mar. 27, 1957